United States Patent
Uetani et al.

(10) Patent No.: US 6,632,581 B2
(45) Date of Patent: Oct. 14, 2003

(54) CHEMICALLY AMPLIFIED POSITIVE RESIST COMPOSITION

(75) Inventors: Yasunori Uetani, Toyonaka (JP); Seong-Hyeon Kim, Seaul (KR)

(73) Assignee: Sumitomo Chemical Company, Limited, Osaka (JP)

(*) Notice: Subject to any disclaimer, the term of this patent is extended or adjusted under 35 U.S.C. 154(b) by 0 days.

(21) Appl. No.: 09/726,476

(22) Filed: Dec. 1, 2000

(65) Prior Publication Data

US 2001/0033987 A1 Oct. 25, 2001

(30) Foreign Application Priority Data

Dec. 3, 1999 (JP) ............................. 11-344446
Jul. 5, 2000 (JP) ............................. 2000-203648

(51) Int. Cl.$^7$ ........................................... G03F 7/004
(52) U.S. Cl. ................... 430/270.1; 430/905; 430/910; 560/120; 526/281
(58) Field of Search ............... 430/270.1, 905, 430/910; 560/120; 526/281

(56) References Cited

U.S. PATENT DOCUMENTS

| | | | | |
|---|---|---|---|---|
| 6,147,249 A | * | 11/2000 | Watanabe et al. | 560/120 |
| 6,153,785 A | * | 11/2000 | Jung | 560/120 |
| 6,160,068 A | * | 12/2000 | Sumino | 526/281 |
| 6,222,061 B1 | * | 4/2001 | Jung | 560/120 |
| 6,239,231 B1 | * | 5/2001 | Fujishima et al. | 525/337 |
| 6,284,429 B1 | * | 9/2001 | Kinsho et al. | 430/270.1 |
| 6,306,554 B1 | * | 10/2001 | Barclay et al. | 430/270.1 |
| 6,399,274 B1 | * | 6/2002 | Kinsho et al. | 430/270.1 |
| 6,420,085 B1 | * | 7/2002 | Nishi et al. | 430/270.1 |
| 6,475,699 B2 | * | 11/2002 | Uetani et al. | 430/270.1 |
| 2001/0014428 A1 | * | 8/2001 | Uetani et al. | 430/270.1 |
| 2001/0024763 A1 | * | 9/2001 | Choi et al. | 430/270.1 |
| 2001/0033987 A1 | * | 10/2001 | Uetani et al. | 430/270.1 |
| 2001/0039080 A1 | * | 11/2001 | Uetani et al. | 438/149 |
| 2001/0046641 A1 | * | 11/2001 | Uetani et al. | 430/270.1 |
| 2002/0146641 A1 | * | 10/2002 | Uetani et al. | 430/270.1 |

FOREIGN PATENT DOCUMENTS

| | | | | |
|---|---|---|---|---|
| EP | 1041422 A1 | * | 10/2000 | G03F/7/004 |
| EP | 1111466 A1 | * | 6/2001 | G03F/7/039 |
| JP | A112903 | | 1/1999 | |
| JP | A1130544 | | 11/1999 | |

* cited by examiner

Primary Examiner—Janet Baxter
Assistant Examiner—Yvette C. Thornton
(74) Attorney, Agent, or Firm—Birch, Stewart, Kolasch & Birch, LLP

(57) ABSTRACT

A chemically amplified positive resist composition is provided which is excellent in sensitivity and resolution; and comprises a resin (X) which, per se, is insoluble or slightly soluble in alkali but becomes soluble in alkali by the action of acid, and has a polymeric unit (a) derived from an alicyclic unsaturated carboxylic acid ester in which a carboxylic acid ester group represented by the formula (I):

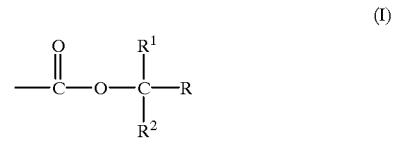

wherein $R^1$ represents an alkyl having 1 to 4 carbon atoms, R represents an alicyclic hydrocarbon residue which may be optionally substituted with a group selected from hydroxyl and oxo, and $R^2$ represents an alkyl having 1 to 4 carbon atoms, or R and $R^2$, together with carbon atoms to which $R^2$ and R are bonded, form a ring, is bonded to an alicyclic hydrocarbon having a polymerizable carbon-carbon double bond in its ring; and a polymeric unit (b) derived from maleic anhydride; and an acid-generating agent (Y).

6 Claims, No Drawings

CHEMICALLY AMPLIFIED POSITIVE RESIST COMPOSITION

BACKGROUND OF THE INVENTION

The present invention relates to a chemical amplifying type positive resist composition used in the minute processing of a semiconductor.

In general, a lithography process using a resist composition has been adopted in the minute processing of a semiconductor. In lithography, the resolution can be improved with a decrease in wavelength of exposure light in principle as expressed by the equation of Rayleigh's diffraction limited. A g-line with a wavelength of 436 nm, an i-line with a wavelength of 365 nm, and a KrF excimer laser with a wavelength of 248 nm have been adopted as exposure light sources for lithography used in the manufacture of a semiconductor. Thus, the wavelength has become shorter year by year. An ArF excimer laser having a wavelength of 193 nm is considered to be promising as a next-generation exposure light source. As exposure light sources after next-generation, an F2 excimer laser with a wavelength of 157 nm and an extreme ultra-violet with a wavelength of 13 nm (EUV) are being considered.

A lens used in an ArF excimer laser exposure machine or an exposure machine using a light-source of shorter wavelength has a shorter lifetime as compared with lenses for conventional exposure light sources. Accordingly, the shorter time required for exposure to ArF excimer laser light is desirable. For this reason, it is necessary to enhance the sensitivity of a resist. Consequently, there has been used a so-called chemical amplifying type resist, which utilizes the catalytic action of an acid generated due to exposure, and contains a resin having a group cleavable by the acid.

It is known that, desirably, resins used in a resist for ArF excimer laser exposure have no aromatic ring in order to ensure the transmittance of the resist, but have an alicyclic ring in place of an aromatic ring in order to impart a dry etching resistance thereto.

Among these resins, a copolymer of an alicyclic unsaturated carboxylic acid ester such as norbornene carboxylate or tetracyclododecene carboxylate and maleic anhydride is by far superior to a resin comprising an alicyclic (meth) acrylate in terms of raw material cost.

Among such alicylic unsaturated carboxylic acid ester resins, those having a tert-butyl group as an acid unstable group which is cleavable due to an action of acid and hence has a function of changing the solubility of the resin, for example, a resin having a unit of tert-butyl 5-norbornene-2-carboxylate represented by the formula below, have been reported and studied. However, resists using these resins have not necessarily exhibited satisfactory resist performance.

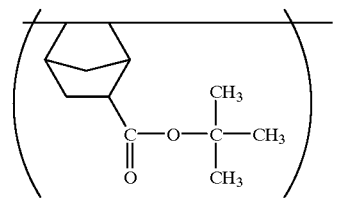

An object of the present invention is to improve various resist performance such as sensitivity and resolution by using a resin having a unit derived from a specified alicyclic unsaturated carboxylic acid ester in a chemically amplified positive resist composition comprising a resin component and an acid-generating agent which is suitable for excimer laser lithography utilizing ArF, KrF or the like. The inventors of the present invention have found the fact that use of a resin containing a copolymer of an alicyclic unsaturated carboxylic acid ester having a specified protective group and maleic anhydride in a resist enables the resist to exhibit an improved resolution. Thus, the present invention has been attained.

SUMMARY OF THE INVENTION

The present invention provides a chemically amplified positive resist composition which comprises a resin (X) which, per se, is insoluble or slightly soluble in alkali but becomes soluble in alkali by the action of acid, and has a polymeric unit (a) derived from an alicyclic unsaturated carboxylic acid ester in which a carboxylic acid ester group represented by the formula (I):

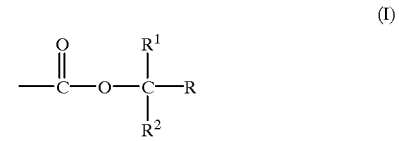

(I)

wherein $R^1$ represents an alkyl having 1 to 4 carbon atoms, R represents an alicyclic hydrocarbon residue which may be optionally substituted with a group selected from hydroxyl and oxo, and $R^2$ represents an alkyl having 1 to 4 carbon atoms, or R and $R^2$, together with carbon atoms to which $R^2$ and R are bonded, form a ring, is bonded to an alicyclic hydrocarbon having a polymerizable: carbon-carbon double bond in its ring; and a polymeric unit (b) derived from maleic anhydride; and an acid-generating agent (Y).

EMBODIMENTS OF THE INVENTION

In the present invention, the resin (X), as a component of the resist composition, is a copolymer of polymeric unit (a) derived from an alicyclic unsaturated carboxylic acid ester in which a carboxylic acid ester group of the above formula (I) is bonded to an alicyclic unsaturated hydrocarbon and polymeric unit (b) derived from maleic anhydride. The resist composition of the present invention is largely characterized by the presence of a bulky protective group such that R is an alicyclic hydrocarbon residue optionally having a substituent, or R and $R^2$, together with carbon atoms to which they are bonded, form a ring. By virtue of this characteristic, the resist composition exhibits improved sensitivity and resolution and is capable of providing a high contrast pattern.

The polymeric unit (a) has a carboxylic acid ester moiety represented in the formula (I), and is formed by opening an unsaturated bond (double bond) in the alicyclic unsaturated ring. The polymeric unit (a) can be represented by the following formula (II):

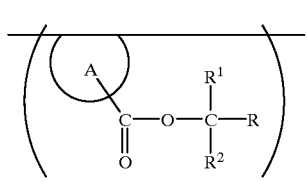

(II)

where $R^1$, R and $R^2$ are as defined above, and a ring A represents an alicyclic hydrocarbon ring.

The polymeric unit (b) derived from maleic anhydride is formed by opening a double bond in maleic anhydride and can be represented by the following formula (III):

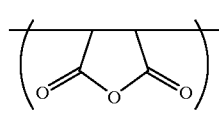

(III)

The resin (X) used in the present invention can be obtained by copolymerization of an alicyclic unsaturated carboxylic acid ester represented by the following formula (IV):

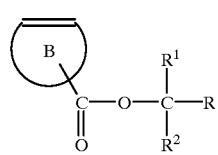

(IV)

where $R^1$, R and $R^2$ are as defined above, and a ring B represents an alicyclic hydrocarbon which becomes the ring A in the formula (II) when its double bond has been opened by polymerization, and maleic anhydride.

In the formulae (I), (II) and (IV), the alkyl group represented by $R^1$ or $R^2$ has 1 to 4 carbon atoms, and examples of such alkyl groups include methyl, ethyl, propyl, isopropyl and butyl. The alicyclic hydrocarbon residue represented by R may be combined with hydroxyl or oxo (=O). Examples of the alicyclic hydrocarbon residue represented by R include monocyclic ones such as cycloalkyl and alkylcycloalkyl in which an alkyl having 1 to 4 carbon atoms is bonded to cycloalkyl, and polycyclic ones such as norbornyl and adamantyl. The alicyclic hydrocarbon residue represented by R usually can have about 5 to about 12 carbon atoms, and specific examples of the alicyclic hydrocarbon residues include cyclohexyl, alkylcyclohexyl, hydroxycyclohexyl, oxocyclohexyl, norbornyl, and adamantyl. The ring formed by R and $R^2$ together with carbon atoms to which they are bonded is also an alicyclic hydrocarbon ring, and examples of such rings include monocyclic ones such as cycloalkyl and alkylcycloalkyl, and polycyclic ones such as norbornyl and adamantyl. The ring formed by R and $R^2$ together with carbon atoms to which they are bonded, also, can have about 5 to about 12 carbon atoms.

The ring A in the formula (II) may be either a monocylic one such as cyclohexane ring or a polycyclic one such as norbornane ring, tricyclodecane ring or tetracyclododecane ring. Particularly, polycyclic ones having two or more rings are preferable. Preferably, the polycyclic ring has 7 to 12 carbon atoms. Accordingly, preferable ones of the unit represented by the formula (II) can generally be represented by the following formula (IIa):

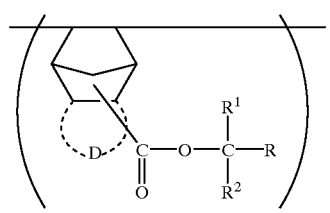

(IIa)

where $R^1$, R and $R_2$ are as defined above, and a bivalent group D depicted by dotted line is either absent or a bivalent saturated hydrocarbon residue. More specifically, in the case where the ring A in the formula (II) is a norbornane ring, the unit can be represented by the formula (IIb) below. In the case where the ring A is a tricyclodecane ring, for example, tricyclo[$5.2.1.0^{2,6}$]decane, the unit can be represented by the formula (IIc) below, and in the case where the ring A is a tetracyclododecane ring, for example, tetracyclo[$6.2.1.1^{3,6}.0^{2,7}$]dodecane, the unit can be represented by the formula (IId) below.

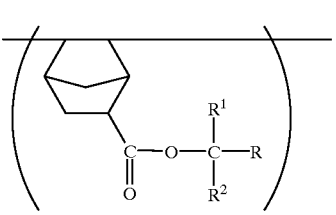

(IIb)

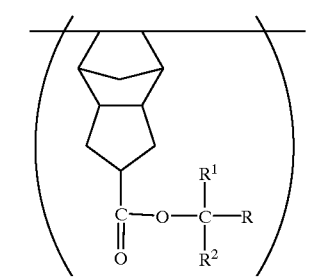

(IIc)

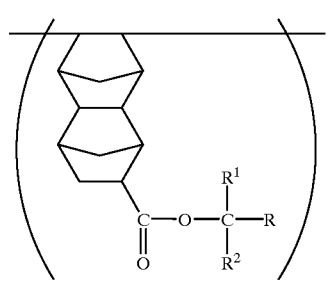

(IId)

where $R^1$, R and $R^2$ are as defined above.

The units represented by the formulae (IIa), (IIb), (IIc) and (IId) are derived from an alicyclic unsaturated carboxylic acid ester represented by the following formula (IVa), 5-norbornene-2-carboxylate represented by the following formula (IVb), tricyclo[$5.2.1.0^{2,6}$]deca-8-ene-4-carboxylate represented by the following formula (IVc), and tetracyclo [$6.2.1.1^{3,6}.0^{2,7}$]dodeca-9-ene-4-carboxylate represented by the following formula (IVd), respectively.

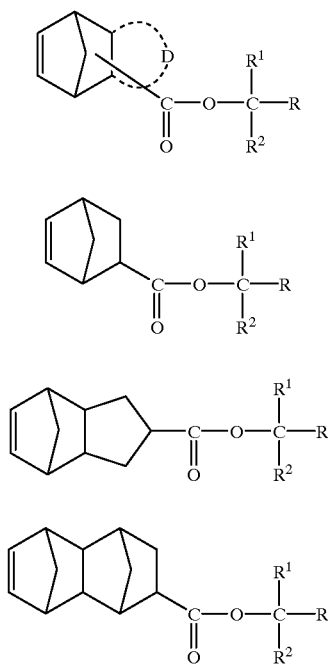

(IVa)

(IVb)

(IVc)

(IVd)

where $R^1$, R and $R^2$ and the bivalent D are as defined above.

The alicyclic unsaturated carboxylic acid ester of the formula (IV), particularly that represented by the formula (IVa), can be prepared by the Diels-Alder reaction of a cycloalkadiene having conjugated double bonds with a corresponding unsaturated carboxylic acid ester. 5-norbornene-2-carboxylate of the formula (IVb) can be prepared from, for example, cyclopentadiene and acrylic acid ester. Tricyclo[5.2.1.0$^{2,6}$]deca-8-ene-4-carboxylate of the formula (IVc) can be prepared from, for example, cyclopentadiene and 3-cyclopentene carboxylate. Tetracyclo[6.2.1.1$^{3,6}$.0$^{2,7}$]dodeca-9-ene-4-carboxylate of the formula (IVd) can be prepared from, for example, cyclopentadiene and 5-norbornene-2-carboxylate of the formula (IVb). The reaction schemes of the above reaction are as follows:

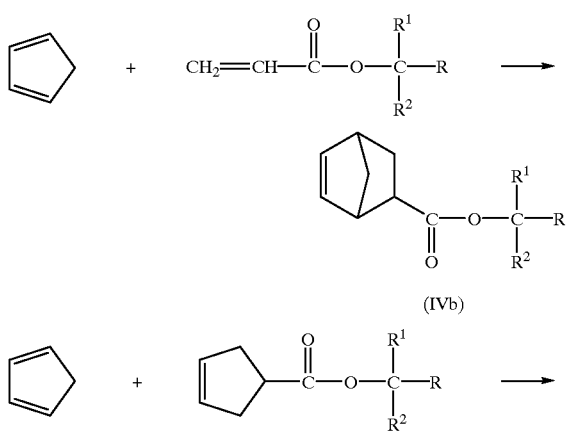

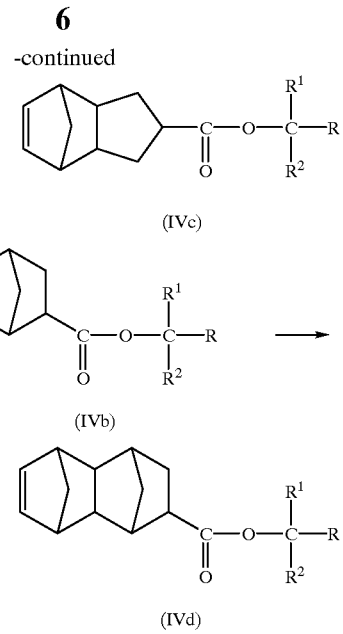

(IVc)

(IVb)

(IVd)

where $R^1$, R and $R^2$ are as defined above.

Examples of specific alicyclic unsaturated carboxylic acid esters of the above formula (IV) include 1-cyclohexyl-1-methylethyl 5-norbornene-2-carboxylate;
1-(4-methylcyclohexyl)-1-methylethyl 5-norbornene-2-carboxylate;
1-(4-hydroxycyclohexyl)-1-methylethyl 5-norbornene-2-carboxylate;
1-methyl-1-(4-oxocyclohexyl)ethyl 5-norbornene-2-carboxylate;
1-(1-adamantyl)-1-methylethyl 5-norbornene-2-carboxylate;
1-methylcyclohexyl 5-norbornene-2-carboxylate;
2-methyl-2-adamantyl 5-norbornene-2-carboxylate;
2-ethyl-2-adamantyl 5-norbornene-2-carboxylate;
1-cyclohexyl-1-methylethyl tricyclo[5.2.1.0$^{2,6}$]deca-8-ene-4-carboxylate;
1-(4-methylcyclohexyl)-1-methylethyl tricyclo[5.2.1.0$^{2,6}$]deca-8-ene-4-carboxylate;
1-(4-hydroxycyclohexyl)-1-methylethyl tricyclo[5.2.1.0$^{2,6}$]deca-8-ene-4-carboxylate;
1-methyl-1-(4-oxocyclohexyl)ethyl tricyclo[5.2.1.0$^{2,6}$]deca-8-ene-4-carboxylate;
1-(1-adamantyl)-1-methylethyl tricyclo[5.2.1.0$^{2,6}$]deca-8-ene-4-carboxylate;
1-methylcyclohexyl tricyclo[5.2.1.0$^{2,6}$]deca-8-ene-4-carboxylate;
2-methyl-2-adamantyl tricyclo[5.2.1.0$^{2,6}$]deca-8-ene-4-carboxylate;
2-ethyl-2-adamantyl tricyclo[5.2.1.0$^{2,6}$]deca-8-ene-4-carboxylate;
1-cyclohexyl-1-methylethyl tetracyclo[6.2.1.1$^{3,6}$.0$^{2,7}$]dodeca-9-ene-4-carboxylate;
1-(4-methylcyclohexyl)-1-methylethyl tetracyclo[6.2.1.1$^{3,6}$.0$^{2,7}$]dodeca-9-ene-4-carboxylate;
1-(4-hydroxycyclohexyl)-1-methylethyl tetracyclo[6.2.1.1$^{3,6}$.0$^{2,7}$]dodeca-9-ene-4-carboxylate;
1-methyl-1-(4-oxocyclohexyl)ethyl tetracyclo[6.2.1.1$^{1,3}$.0$^{2,7}$]dodeca-9-ene-4-carboxylate;
1-(1-adamantyl)-1-methylethyl tetracyclo[6.2.1.1$^{3,6}$.0$^{2,7}$]dodeca-9-ene-4-carboxylate;
1-methylcyclohexyl tetracyclo[6.2.1.1$^{3,6}$.0$^{2,7}$]dodeca-9-ene-4-carboxylate;

2-methyl-2-adamantyl tetracyclo[6.2.1.1$^{3,6}$.0$^{2,7}$]dodeca-9-ene-4-carboxylate; and
2-ethyl-2-adamantyl tetracyclo[6.2.1.1$^{3,6}$.0$^{2,7}$]dodeca-9-ene-4-carboxylate.

A resin for a chemical amplifying type positive resist itself is generally alkali-insoluble or alkali-slightly soluble However, a part of a group therein is cleaved by the action of an acid, and the resin becomes alkali-soluble after the cleavage. In the resin specified in the present invention, 2-alkyl-2-adamantyl in the formula (I) or 2-ethyl-2-adamantyl in the formula (Ia) is cleaved by the action of an acid. Therefore, the presence of the polymerization unit of the formula (I) or the formula (Ia) in a resin causes a resist composition containing the resin to act as a positive type. If required, the resin may also comprise other polymerization units which are cleaved by the action of an acid.

Concrete examples of the other groups which are cleaved by the action of an acid include various esters of carboxylic acid. Examples thereof include alkyl ester including tert-butyl ester as a typical example, acetal type esters such as methoxymethyl ester, ethoxymethyl ester, 1-ethoxyethyl ester, 1-isobutoxyethyl ester, 1-isopropoxyethyl ester, 1-ethoxypropyl ester, 1-(2-methoxyethoxy)ethyl ester, 1-(2-acetoxyethoxy)ethyl ester, 1-[2-(1-adamantyloxy)ethoxy] ethyl ester, 1-[2-(1-adamantanecarbonyloxy)ethoxy]ethyl ester, tetrahydro-2-furyl ester, and tetrahydro-2-pyranyl ester, and alicyclic esters such as isobornyl ester. The monomers leading to the polymerization units having such carboxylic acid esters may be acrylic ones such as methacrylate and acrylate, or may be the ones in which carboxylic acid ester groups are bonded to alicyclic monomers such as norbornene carboxylate, tricyclodecene carboxylate, and tetracyclodecene carboxylate.

The resin (X) used in the present invention preferably contains 20 to 70 mol % of a polymeric unit having a group cleavable by the action of acid, though that range is variable depending on the sort of radiation to be used in patterning exposure, the kind of the group which is cleavable by the action of acid, or a like. Thus, generally the polymeric unit (a) is preferably contained in the resin (X) in an amount within the range described above. Unless the advantageous effects of the present invention are impaired, the resin may further contain any other polymeric units. Examples of the other polymeric units include norbornene, a norbornene carboxylate having a carboxylic acid ester moiety not belonging to the formula (I) and incapable of cleavage by the action of acid, a (meth)acrylic acid, or a (meth)acrylic ester incapable of cleavage by the action of acid. As desired, the resist composition of the present invention may further comprise any other resin in addition to the resin (X).

The acid generator which is another component is decomposed to generate an acid by irradiating the component itself or a resist composition including the component with radioactive rays such as light and an electron beam. The acid generated from the acid generator acts on the resin to cleave the group which is to be cleaved by the action of an acid present in the resin. Examples of such acid generators include onium salt compounds, organic halogen compounds, sulfone compounds, and sulfonate compounds. Specifically, the following compounds can be mentioned:

diphenyliodonium trifluoromethanesulfonate,
4-methoxyphenylphenyliodonium hexafluoroantimonate,
4-mthoxyphenylphenyliodonium trifluoromethanesulfonate,
bis(4-tert-butylphenyl)iodonium tetrafluoroborate,
bis(4-tert-butylphenyl)iodonium hexafluorophosphate,
bis(4-tert-butylphenyl)iodonium hexafluoroantimonate,
bis(4-tert-butylphenyl)iodonium trifluoromethanesulfonate,
triphenylsulfonium hexafluorophosphate,
triphenylsulfonium hexafluoroantimonate,
triphenylsulfonium trifluoromethanesulfonate,
4-methoxyphenyldiphenylsulfonium hexafluoroantimonate,
4-methoxyphenyldiphenylsulfonium trifluoromethanesulfonate,
p-tolyldiphenylsulfonium trifluoromethanesulfonate,
p-tolyldiphenylsulfonium perfluorooctanesulfonate,
2,4,6-trimethylphenyldiphenylsulfonium trifluoromethanesulfonate,
4-tert-butylphenyldiphenylsulfonium trifluoromethanesulfonate,
4-phenylthiophenyldiphenylsulfonium hexafluorophosphate,
4-phenylthiophenyldiphenylsulfonium hexafluoroantimonate,
1-(2-naphthoylmethyl)thiolanium hexafluoroantimonate,
1-(2-naphthoylmethyl)thiolanium trifluoromethanesulfonate,
4-hydroxy-1-naphthyldimethylsulfonium hexafluoroantimonate,
4-hydroxy-1-naphthyldimethylsulfonium trifluoromethanesulfonate,
2-methyl-4,6-bis(trichloromethyl)-1,3,5-triazine,
2,4,6-tris(trichloromethyl)-1,3,5-triazine,
2-phenyl-4,6-bis(trichloromethyl)-1,3,5-triazine,
2-(4-chlorophenyl)-4,6-bis(trichloromethyl)-1,3,5-triazine,
2-(4-methoxyphenyl)-4,6-bis(trichloromethyl)-1,3,5-triazine,
2-(4-methoxy-1-naphthyl)-4,6-bis(trichloromethyl)-1,3,5-triazine,
2-(benzo[d][1,3]dioxolane-5-yl)-4,6-bis(trichloromethyl)-1,3,5-triazine,
2-(4-methoxystyryl)-4,6-bis(trichloromethyl)-1,3,5-triazine,
2-(3,4,5-trimethoxystyryl)-4,6-bis(trichloromethyl)-1,3,5-triazine,
2-(3,4-dimethoxystyry )-4,6-bis(trichloromethyl)-1,3,5-triazine,
2-(2,4-dimethoxystyryl)-4,6-bis(trichloromethyl)-1,3,5-triazine,
2-(2-methoxystyryl)-4,6-bis(trichloromethyl)-1,3,5-triazine,
2-(4-butoxystyryl)-4,,6-bis(trichloromethyl)-1,3,5-triazine,
2-(4-pentyloxystyryl)-4,6-bis(trichloromethyl)-1,3,5-triazine,
1-benzoyl-1-phenylmethyl p-toluenesulfonate (so-called benzointosylate),
2-benzoyl-2-hydroxy-2-phenylethyl p-toluenesulfonate (so-called α-methylolbenzointosylate),
1,2,3-benzenetriyl trimethanesulfonate,
2,6-dinitrobenzyl p-toluenesulfonate,
2-nitrobenzyl p-toluenesulfonate,
4-nitrobenzyl p-toluenesulfonate,
diphenyl disulfone,
di-p-tolyl disulfone,,
bis(phenylsulfonyl)diazomethane,
bis(4-chlorophenylsulfonyl)diazomethane,
bis(p-tolylsulfonyl)diazomethane,
bis(4-tert-butylphenylsulfonyl)diazomethane,
bis(2,4-xylylsulfonyl)diazomethane,
bis(cyclohexylsulfonyl)diazomethane,
(benzoyl)(phenylsulfonyl)diazomethane,
N-(phenylsulfonyloxy)succinimide,
N-(trifluoromethylsulfonyloxy)succinimide,
N-(trifluoromethylsulfonyloxy)phthalimide,
N-(trifluoromethylsulfonyloxy)-5-norbornene-2,3-dicarboxyimide, N-(trifluoromethylsulfonyloxy)naphthalimide,
N-(10-camphorsulfonyloxy)naphthalimide, and the like.

It is also known that, generally in a chemical amplifying type positive resist composition, performance deterioration due to the deactivation of an acid associated with leaving after exposure can be reduced by adding basic compounds, especially basic nitrogen-containing organic compounds such as amines as quenchers. It is also preferable in the present invention that such basic compounds are added. Concrete examples of the basic compounds to be used as quenchers include the ones represented by the following formulae:

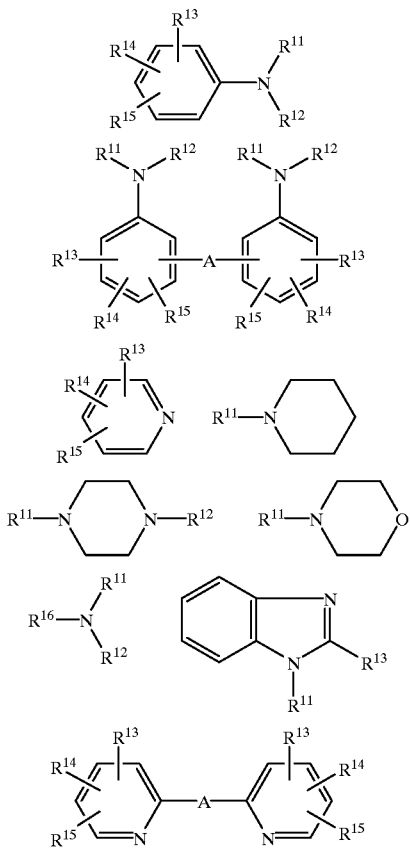

wherein $R^{11}$ and $R^{12}$, which are same or different from each other, represent hydrogen, cycloalkyl, aryl or alkyl which may be optionally substituted with a hydroxyl; $R^{13}$, $R^{14}$ and $R^{15}$, which are same or different from each other, represent hydrogen, cycloalkyl, aryl, alkoxy or alkyl which may be optionally substituted with a hydroxyl; $R^{16}$ represents cycloalkyl or alkyl which may be optionally substituted with a hydroxyl; A represents alkylene, carbonyl or imino. The alkyl represented by $R^{11}$ to $R^{16}$ and alkoxy represented by $R^{13}$ to $R^{15}$ may have about 1 to 6 carbon atoms. The cycloalkyl may have about 5 to 10 carbon atoms and the aryl may have about 6 to 10 carbon atoms. The aryl represented by $R^{11}$ to $R^{15}$ may have about 6 to 10 carbon atoms. The alkylene represented by A may have about 1 to 6 carbon atoms and may be straight-chained or branched.

The resist composition of the present invention preferably contains the resin(X) in an amount in the range of 80 to 99.9% by weight, and the acid generating agent(Y) in an of 0.1 to 20% by weight based on the total solid component weight of the composition. When a basic compound is used as a quencher, it is preferably contained in an amount in the range of 0.0001 to 0.1% by weight based on the total solid component weight of the resist composition. The composition may also contain, if required, various additives such as sensitizers, dissolution inhibitors, other resins, surfactants, stabilizers, and dyes in small amounts.

The resist composition of the present invention generally becomes a resist solution in the state in which the above-described components are dissolved in a solvent to be applied on a substrate such as a silicon wafer. The solvent herein used may be one which dissolves each component, has an appropriate drying rate, and provides a uniform and smooth coating after evaporation of the solvent, and can be one which is generally used in this field. Examples thereof include glycol ether esters such as ethylcellosolve acetate, methylcellosolve acetate, and propylene glycol monomethyl ether acetate; esters such as ethyl lactate, butyl acetate, amyl acetate, and ethyl pyruvate; ketones such as acetone, methyl isobutyl ketone, 2-heptanone, and cyclohexanone; and cyclic esters such as γ-butyrolactone. These solvents can be used alone or in combination of two or more thereof.

The resist film applied on a substrate, and dried is subjected to an exposure treatment for patterning. Then, after a heat-treatment for promoting a protecting deblocking reaction, development by an alkali developer is conducted. The alkali developer herein used can be various kinds of alkaline aqueous solutions used in this field. In general, an aqueous solution of tetramethylammoniumhydroxide or (2-hydroxyethyl)trimethylammoniumhydroxide (so-called colline) is often used.

Next, the present invention will be described in more detail by way of examples, which should not be construed as limiting the scope of the present invention. All parts in examples are by weight unless otherwise stated. The weight-average molecular weight is a value determined from gel permeation chromatography using polystyrene as a reference standard.

Monomer Synthesis 1
(Preparation of tert-butyl 5-norbornene-2-carboxylate)

A large excess of fresh cyclopentadiene obtained by distillation was subjected to the Diels-Alder reaction with 86.0 g (0.67 mol) of tert-butyl acrylate at room temperature. The resulting reaction product was distilled under a low pressure at a boiling point of 80° C. to give tert-butyl 5-norbornene-2-carboxylate with a yield of 90% on a tert-butyl acrylate basis. The chemical reaction formula of this example is as follows.

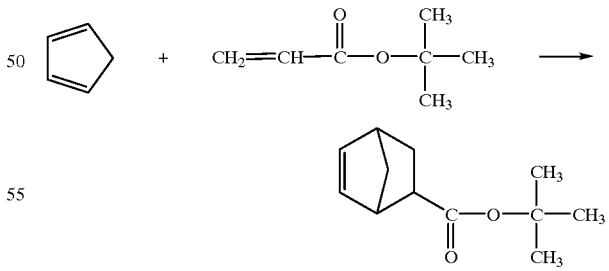

Monomer Synthesis 2
(Preparation of 1-(4-methylcyclohexyl)-1-methylethyl 5-norbornene-2-carboxylate)

A large excess of fresh cyclopentadiene obtained by distillation was subjected to the Diels-Alder reaction with 20.0 g (95.2 mmol) of 1-(4-methylcyclohexyl)-1-methylethyl acrylate at room temperature. The resulting reaction product was distilled under a low pressure at a boiling point of 145° C. to give 1-(4-methylcyclohexyl)-1-methylethyl 5-norbornene-2-carboxylate with a yield of 80% on a 1-(4-methylcyclohexyl)-1-methylethyl acrlate basis. The chemical reaction formula of this example is as follows.

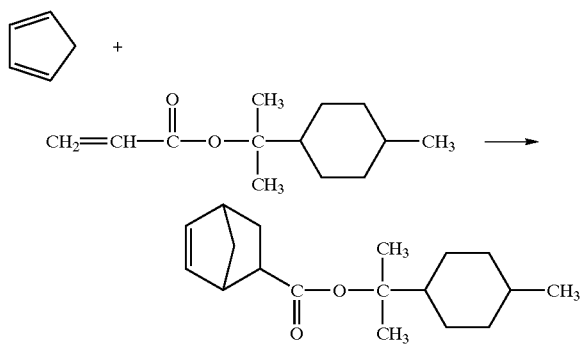

Monomer Synthesis 3

(Preparation of 1-(1-adamantyl)-1-methylethyl 5-norbornene-2-carboxylate)

A large excess of fresh cyclopentadiene obtained by distillation was subjected to the Diels-Alder reaction with 25.0 g (0.10 mol) of 1-(1-adamantyl)-1-methylethyl acrylate at room temperature. The resulting reaction product was recrystalized in methanol to give 1-(1-adamantyl)-1-methylethyl 5-norbornene-2-carboxylate with a yield of 50% on a 1-(1-adamantyl)-1-methylethyl acrylate basis. The chemical reaction formula of this example is as follows.

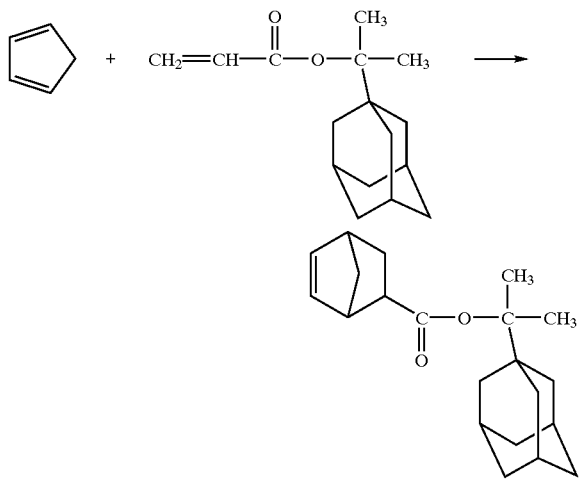

Monomer Synthesis 4

(Preparation of 2-(2-methyl)adamantyl 5-norbornene-2-carboxylate)

A large excess of fresh cyclopentadiene obtained by distillation was subjected to the Diels-Alder reaction with 158 g (0.72 mol) of 2-(2-methyl)adamantyl acrylate at room temperature. The resulting reaction product was purified with silica gel chromatography to give 2-(2-methyl)adamantyl 5-norbornene-2-carboxylate with a yield of 50% on a 2-(2-methyl)adamantyl acrylate basis. The chemical reaction formula of this example is as follows.

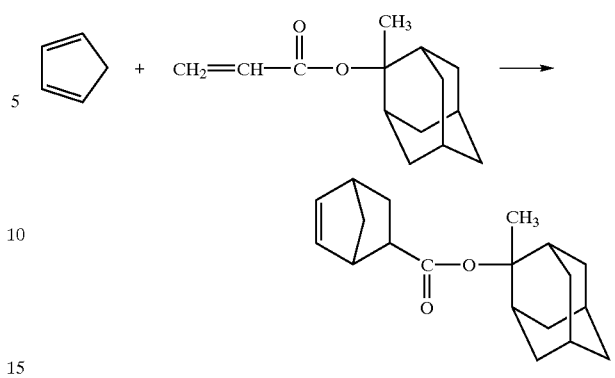

Resin Synthesis 1
(Preparation of a tert-butyl 5-norbornene-2-carboxylate/maleic anhydride copolymer)

To a mixture of 15 g (77.2 mmol) of tert-butyl 5-norbornene-2-carboxylate obtained in the above Monomer Systhesis 1 and 7.57 g (77.2 mmol) of maleic anhydride was added 45.0 g of 4-dioxane to form a solution, which was then heated to 80° C. in a nitrogen atmosphere. To the solution thus heated was added 0.25 g of 2,2'-azobisisobutyronitrile as an initiator, followed by stirring for 48 hours. Thereafter, this reaction mass was mixed with a large quantity of n-heptane to cause a resin to precipitate, followed by filtration. The resulting wet cake was dissolved in 1,4-dioxane, and the resulting solution was mixed with a large quantity of n-heptane to cause a resin to precipitate. By repeating the process from dissolution to precipitation twice for purification, a copolymer having a weight-average molecular weight of 4,750 and a degree of dispersion (=weight average molecular weight/number average molecular weight)of 1.6 was obtained. The copolymer thus obtained is referred to as Resin X.

Resin Synthesis 2
(Preparation of a 1-(4-methylcyclohexyl)-1-methylethyl 5-norbornene-2-carboxylate/maleic anhydride copolymer)

To a mixture of 24.0 g (86.9 mmol) of 1-(4-methylcyclohexyl)-1-methylethyl 5-norbornene-2-carboxylate obtained in the above Monomer Systhesis 2 and 8.5 g (86.9 mmol) of maleic anhydride was added 65.0 g of tetrahydrofuran to form a solution, which was then heated to 60° C. in a nitrogen atmosphere. To the solution thus heated was added 0.28 g of 2,2'-azobisisobutyronitrile as an initiator, followed by stirring for 24 hours. Thereafter, this reaction mass was mixed with a large quantity of n-heptane to cause a resin to precipitate, followed by filtration. The resulting wet cake was dissolved in tetrahydrofuran, and the resulting solution was mixed with a large quantity of n-heptane to cause a resin to precipitate. By repeating the process from dissolution to precipitation twice for purification, a copolymer having a weight-average molecular weight of 3,500 and a degree of dispersion of 1.5 was obtained. The copolymer thus obtained is referred to as Resin A.

Resin Synthesis 3
(Preparation of a 1-(1-adamantyl)-1-methylethyl 5-norbornene-2-carboxylate/maleic anhydride copolymer)

To a mixture of 10.0 g (31.8 mmol) of 1-(1-adamantyl)-1-methylethyl 5-norbornene-2-carboxylate obtained in the above Monomer Systhesis 3 and 3.1 g (31.8 mmol) of maleic anhydride was added 26.3 g of tetrahydrofuran to form a solution, which was then heated to 65° C. in a nitrogen atmosphere. To the,solution thus heated was added 0.21 g of 2,2'-azobisisobutytonitrile as an initiator, followed by stirring for 24 hours. Thereafter, the same purification process was carried out as in Resin Synthesis 2 to obtain a copolymer having a weight-average molecular weight of 3,530 and a degree of dispersion of 1.27. The copolymer thus obtained is referred to as Resin B.

Resin Synthesis 4

(Preparation of a 2-(2-methyl)adamantyl 5-norbornene-2-carboxylate/maleic anhydride copolymer)

To a mixture of 2-(2-methyl)adamantyl 5-norbornene-2-carboxylate obtained in the Monomer Synthesis 4 and maleic anhydride in a molar ratio of 1:1 (15.0 g:5.17 g) was added tetrahydrofuran in a weight twice as large as the total weight of all the mononers used thereto to form a solution. To the solution was added azobisisobutyronitrile as an initiator in an amount of 2 mol % relative to the total amount of the monomers, and the mixture was heated to 65° C. in a nitrogen atmosphere, followed by stirring for 24 hours. Thereafter, a process of pouring the reaction mass into a large quantity of methanol to cause precipitation was repeated three times for purification of resin to obtain 4.63 g of a copolymer having a molecular weight of about 4,300 and a degree of dispersion of 1.37. This copolymer thus obtained is referred to as Resin C.

Examples and Comparative Example

Components listed below were mixed and filtered through a fluorine resin filter having a pore diameter of 0.2 μm to give resist solutions.

| | |
|---|---:|
| Resin A, B or X | 10 parts |
| Acid generating agent: p-tolyldiphenylsulfonium trifluoromethanesulfonate | 0.1 part |
| Quencher: 2,6-diidopropyl aniline | 0.0075 part |
| Solvent: propylene glycol monomethyl ether acetate | 57 parts |
| γ-butylolactone | 3 parts |

On a silicon wafer, a composition "DUV-42" manufactured by Brewer Co. Ltd. was applied and baked under conditions of 215° C. for 60 seconds so that an organic reflection-preventing membrane having a thickness of 1,600 angstrom was formed on the wafer. The resist solution obtained above was applied on said wafer so that the film thickness after drying was 0.385 μm. After applying the resist solution, the wafer was pre-baked on a direct hotplate at a temperature shown in Table 1, column "Pre-bake" for 60 seconds. The wafer having a resist film formed thereon was irradiated with a ArF eximer stepper ["NSR-ArF", manufactured by Nikon, NA=0.55, σ=0.6] through a line-and-space pattern, changing stepwise the exposure amount. The exposed wafer was subjected to post-exposure baking (PEB) on a hot plate under at a temperature shown in Table 1, column "PEB" for 60 seconds. Then the wafer was subjected to paddle development with 2.38% by weight aqueous tetramethyl ammonium hydroxide solution for 60 seconds. The developed line-and-space pattern was observed by a scanning electron microscope and assessed for the effective sensitivity and the resolution by the following methods:

Effective sensitivity: This is expressed in the minimum amount of exposure which gave 1:1 line-and-space pattern of 0.20 μm.

Resolution: This is expressed in the minimum size which gave line-and-space pattern spitted at the exposure amount of the effective sensitivity.

TABLE 1

| | | Temperature °C. | | Effective sensitivity (KrF) | Resolution (KrF) |
|---|---|---|---|---|---|
| | Resin | Pre-bake | PEB* | | |
| Example 1 | A | 130 | 130 | 34 mJ/cm2 | 0.16 μm |
| Example 2 | B | 14 | 115 | 26 mJ/cm2 | 0.16 μm |
| Example 3 | C | 140 | 115 | 78 mJ/cm2 | 0.17 μm |
| Comparative Example | X | 130 | 130 | 82 mJ/cm2 | 0.18 μm |

*PEB: Post Exposure Bake

The resist composition of the present invention is excellent in sensitivity and resolution. It is also good in other resist performances. Accordingly, it can be suitably used in fine processes for producing a semiconductor.

What is claimed is:

1. A chemically amplified positive resist composition which comprises a resin (X) which is insoluble or slightly soluble in alkali but becomes soluble in alkali by the action of acid, and has a polymeric unit (a) derived from an alicyclic unsaturated carboxylic acid ester in which a carboxylic acid ester group represented by the formula (I):

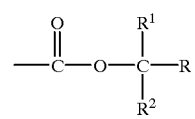

wherein $R^1$ represents an alkyl having 1 to 4 carbon atoms, R represents an alicyclic hydrocarbon residue which may be optionally substituted with a group selected from hydroxyl and oxo, and $R^2$ represents an alkyl having 1 to 4 carbon atoms, is bonded to an alicyclic hydrocarbon having a polymerizable carbon-carbon double bond in its ring backbone structure; and a polymeric unit (b) derived from maleic anhydride; and an acid-generating agent (Y).

2. The positive resist composition according to claim 1, wherein R in the formula (I) is monocyclic or polycyclic, and has about 5 to about 12 carbon atoms.

3. The positive resist composition according to claim 1, wherein R in the formula (I) is cyclohexyl, alkylcyclohexyl, hydroxycyclohexyl, oxocyclohexyl, norbornyl or adamantyl.

4. The positive resist composition according to claim 1, wherein the alicyclic unsaturated hydrocarbon ring in the alicyclic unsaturated carboxylic acid ester is a polycyclic ring having two or more rings and having 7–12 carbon atoms.

5. The positive resist composition according to claim 1, wherein the polymeric unit derived from the alicyclic unsaturated carboxylic acid ester is represented by the following formula (IIa):

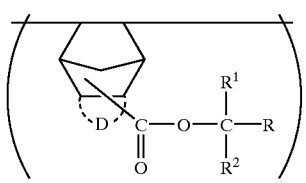
(IIa)
where R1, R and R2 are as defined in claim 1, and a bivalent group D depicted by dotted line is either absent or a bivalent saturated hydrocarbon residue.
6. The positive resist composition according to claim 1, which further comprises an amine as a quencher.
\* \* \* \* \*